United States Patent
Watanabe et al.

(10) Patent No.: US 9,736,924 B2
(45) Date of Patent: Aug. 15, 2017

(54) REINFORCING MEMBER FOR FLEXIBLE PRINTED WIRING BOARD, FLEXIBLE PRINTED WIRING BOARD, AND SHIELD PRINTED WIRING BOARD

(71) Applicant: TATSUTA ELECTRIC WIRE & CABLE CO., LTD., Higashiosaka-shi, Osaka (JP)

(72) Inventors: Masahiro Watanabe, Higashiosaka (JP); Hiroshi Tajima, Higashiosaka (JP)

(73) Assignee: TATSUTA ELECTRIC WIRE & CABLE CO., LTD., Higashiosaka-Shi, Osaka (JP)

( * ) Notice: Subject to any disclaimer, the term of this patent is extended or adjusted under 35 U.S.C. 154(b) by 0 days.

(21) Appl. No.: 14/770,118

(22) PCT Filed: Feb. 25, 2014

(86) PCT No.: PCT/JP2014/054465
§ 371 (c)(1),
(2) Date: Aug. 25, 2015

(87) PCT Pub. No.: WO2014/132951
PCT Pub. Date: Sep. 4, 2014

(65) Prior Publication Data
US 2016/0007444 A1 Jan. 7, 2016

(30) Foreign Application Priority Data
Feb. 26, 2013 (JP) .................................. 2013-035890

(51) Int. Cl.
*H05K 1/00* (2006.01)
*H05K 1/02* (2006.01)
(Continued)

(52) U.S. Cl.
CPC ........... *H05K 1/0218* (2013.01); *H05K 1/028* (2013.01); *H05K 1/0215* (2013.01);
(Continued)

(58) Field of Classification Search
CPC ........ H05K 1/02; H05K 1/028; H05K 1/0215; H05K 1/0218; H05K 3/10; H05K 3/321;
(Continued)

(56) References Cited

U.S. PATENT DOCUMENTS 5,053,922 A * 10/1991 Matta ................ H01L 21/67138
165/185
5,142,444 A * 8/1992 Matta ................ H01L 21/67138
165/185
(Continued)

FOREIGN PATENT DOCUMENTS

JP 2000183109 6/2000
JP 2000269632 9/2000
(Continued)

OTHER PUBLICATIONS

International Search Report, PCT/JP2014/054465, Apr. 1, 2014.
(Continued)

*Primary Examiner* — Xiaoliang Chen
(74) *Attorney, Agent, or Firm* — KMF Patent Services, PLLC; S. Peter Konzel; Kenneth M. Fagin

(57) ABSTRACT

A reinforcing member for a flexible printed wiring board that maintains an electromagnetic wave shielding effect and a ground effect of the printed wiring board over a long period of time. A reinforcing member is disposed opposite a predetermined part of a ground wiring pattern and includes one surface opposing and in electrical conduction with the predetermined part of the ground wiring pattern. The other surface is in electrical conduction with an external ground member which is at a ground potential, the one surface and
(Continued)

the other surface opposing each other. The reinforcing member includes a base made of conductive metal and a surface layer formed on a surface of a base to constitute at least a part of the other surface, the surface layer has higher conductivity and corrosion resistance than the base made of metal, and the surface layer is 0.004 to 0.2 μm thick.

7 Claims, 7 Drawing Sheets

(51) Int. Cl.
 H05K 1/18 (2006.01)
 H05K 3/32 (2006.01)
 H05K 1/09 (2006.01)
(52) U.S. Cl.
 CPC ............ *H05K 1/0281* (2013.01); *H05K 1/09* (2013.01); *H05K 1/189* (2013.01); *H05K 3/321* (2013.01); *H05K 2201/0715* (2013.01); *H05K 2201/1028* (2013.01); *H05K 2201/2009* (2013.01)
(58) Field of Classification Search
 CPC ......... H01L 21/00; H01L 23/06; H01L 23/10; H01L 23/24; H01L 23/32; H01L 23/48; H01L 23/52; H01L 23/055
 USPC ............... 174/254, 260, 263, 538, 551, 560; 361/704, 720, 753, 809; 439/65, 72, 331; 29/846, 874
 See application file for complete search history.

(56) References Cited

U.S. PATENT DOCUMENTS

| | | | | |
|---|---|---|---|---|
| 5,371,321 | A * | 12/1994 | Hamzehdoost | H01L 23/055 174/538 |
| 5,438,478 | A * | 8/1995 | Kondo | H01L 23/4334 174/260 |
| 5,975,915 | A * | 11/1999 | Yamazaki | G01R 1/0433 439/331 |
| 6,391,684 | B2 * | 5/2002 | Ohsawa | H01L 23/24 257/666 |
| 8,994,157 | B1 * | 3/2015 | Kiew | H01L 21/4832 257/666 |
| 2005/0281994 | A1 | 12/2005 | Tani et al. | |
| 2006/0199402 | A1 | 9/2006 | Ishii et al. | |
| 2007/0025570 | A1 * | 2/2007 | Yonehara | H04R 19/04 381/174 |
| 2008/0048342 | A1 * | 2/2008 | Cheah | H01L 23/49524 257/777 |
| 2009/0189263 | A1 * | 7/2009 | Baba | H01L 23/36 257/676 |
| 2010/0041252 | A1 * | 2/2010 | Mizukami | H01R 12/57 439/65 |
| 2010/0164518 | A1 * | 7/2010 | Yamada | G01R 1/07314 324/756.03 |
| 2010/0165594 | A1 * | 7/2010 | Kim | H05K 1/147 361/809 |
| 2010/0259582 | A1 * | 10/2010 | Miyakoshi | B41J 2/06 347/47 |
| 2010/0327450 | A1 * | 12/2010 | Uno | H01L 24/43 257/762 |
| 2012/0081864 | A1 * | 4/2012 | Sakurai | H01L 23/49822 361/753 |
| 2012/0124829 | A1 * | 5/2012 | Kamei | G11B 5/486 29/846 |
| 2013/0084718 | A1 * | 4/2013 | Kobayashi | H01R 13/2442 439/81 |

FOREIGN PATENT DOCUMENTS

| | | |
|---|---|---|
| JP | 2001291945 | 10/2001 |
| JP | 2004197224 | 7/2004 |
| JP | 2006245220 | 9/2006 |
| JP | 2006344646 | 12/2006 |
| JP | 2007157209 | 6/2007 |
| JP | 2007189091 | 7/2007 |
| JP | 2009218443 | 9/2009 |
| JP | 2012-156457 | 8/2012 |
| JP | 2012158457 | 8/2012 |
| JP | 2015502927 | 8/2012 |
| TW | 201233262 A | 8/2012 |
| TW | 516352 | 1/2013 |

OTHER PUBLICATIONS

Taiwanese Office Action, App. No. 103106338, Apr. 27, 2016.
International Preliminary Examination Report, Int. App. No. PCT/JP2014/054465, Sep. 1, 2015.
Notification from Japanese Patent Office, App No. 2015-502927, mailed Jun. 7, 2016.
Notice of Reasons of Rejection, Japanese Pat. App. No. 2015-502927, mailed Dec. 13, 2016.
Decision of Rejection, Taiwanese Pat. App. No. 103106338, dated Jan. 16, 2017.
Notificatiion of Filing Documents, Japanese Pat. App. No. 2015-502927, dated Mar. 21, 2017.
Notice of Reasons for Rejection, Japanese Pat. App. No. 2015-502927, dated Mar. 28, 2017.
Decision of Rejection, Japanese Pat. App. No. 2015-502927, dated Jun. 13, 2017.

\* cited by examiner

REINFORCING MEMBER FOR FLEXIBLE PRINTED WIRING BOARD, FLEXIBLE PRINTED WIRING BOARD, AND SHIELD PRINTED WIRING BOARD

CROSS REFERENCE TO RELATED APPLICATIONS

This is the national stage of International Pat. App. No. PCT/JP2014/054465, filed Feb. 25, 2014, which application claims priority to Japanese Pat. App. No. 2013035890, filed Feb. 26, 2013, each of which applications are incorporated herein by reference.

TECHNICAL FIELD

The present invention relates to a reinforcing member for a flexible printed wiring board, a flexible printed wiring board, and a shield printed wiring board which are used in mobile phones, computers, or the like.

BACKGROUND

A flexible printed wiring board in which a thin plate-shaped reinforcing member (metal reinforcing plate) formed of stainless steel or the like is pasted on a side opposing a component mounting side has been known. In the meanwhile, for a flexible printed wiring board used in electronic devices such as mobile phones and computers, electric connection of a reinforcing member with a ground circuit of a flexible printed wiring board by means of a conductive adhesive and direct connection of the reinforcing member with a housing have been proposed in consideration of electromagnetic wave noise (see PTL 1 and PTL 2).

On account of recent popularity of electronic devices such as mobile phones and computers utilizing high-frequency signals, it has been demanded to enhance the ground effect by ascertaining the connection between the reinforcing member and the ground circuit and the connection between the reinforcing member and the housing.

CITATION LIST

Patent Literatures

[PTL 1] Japanese Unexamined Patent Publication 2007-189091
[PTL 2] Japanese Unexamined Patent Publication 2009-218443

SUMMARY

Technical Problem

In regard to the above, a passive film may be formed on the reinforcing member and the electric resistance is disadvantageously increased due to various reasons, depending on the material of the reinforcing member. In such cases, the ground effect is deteriorated. The material of the reinforcing member is typically stainless steel; the aforesaid problem tends to occur in a reinforcing member made of stainless steel, too. Reasons of the generation of the passive film on the reinforcing member include aged deterioration of the printed wiring board, thermal treatment of the printed wiring board in manufacturing process, and external environments (e.g., a high-temperature and high-moisture environment) of the printed wiring board or of an electronic devices on which the printed wiring board is mounted.

The present invention has been done in consideration of the problem above, and an object of the present invention is to provide a reinforcing member for a flexible printed wiring board, a flexible printed wiring board, and a shield printed wiring board, which are able to maintain the ground effect of the printed wiring board over a long period of time.

Solution to Problem

A reinforcing member for a flexible printed wiring board of the present invention (hereinafter, this will be simply referred to as a reinforcing member for a printed wiring board) of the present invention is disposed opposite to a predetermined part of a ground wiring pattern of the printed wiring board and includes one surface in electrical conduction with the predetermined part of the ground wiring pattern via a conductive composition layer and the other surface in electrical conduction with an external ground member at a ground potential. The one surface and the other surface are opposing each other. This reinforcing member for the printed wiring board includes: a metal base which is conductive; and a surface layer which is formed on a surface of the metal base to constitute at least apart of the other surface, the surface layer having higher conductivity and corrosion resistance than the metal base, and the surface layer being 0.004 to 0.2 μm thick.

According to the configuration above, when the reinforcing member for the printed wiring board is adhered to the printed wiring board, the predetermined part of the ground wiring pattern of the printed wiring board is reinforced mainly by the strength of the metal base. Furthermore, because the predetermined part of the ground wiring pattern is in electrical conduction with the external ground member, the ground effect is improved and maintained. Furthermore, even after the exposure to a high-temperature and high-moisture environment, the ground effect and the contact strength between the reinforcing member and the printed wiring board are maintained.

In regard to the above, because the surface layer has higher corrosion resistance than the metal base, the speed of the generation of a passive film on the reinforcing member due to external circumstances after the reinforcing member is pasted onto the printed wiring board, aged deterioration, or the like slows down as compared to cases where the reinforcing member is formed solely of the base. This prevents the electric resistance of the reinforcing member from becoming high on account of the passive film on the reinforcing member and therefore prevents the ground effect of the printed wiring board from being deteriorated.

In addition to the above, because the surface layer has higher conductivity than the metal base, the reinforcing member and the external ground member are in electrical conduction with each other with a lower electric resistance than in cases where the reinforcing member is formed solely of the metal base, and hence the ground effect is improved.

Furthermore, because the metal base is protected from the external environment by the surface layer, options of the metal base is increased. With this, the reinforcing member for the printed wiring board is suitably configured in accordance with the specification of the reinforcement and the cost.

In addition to the above, in the reinforcing member for the printed wiring board of the present invention, the surface layer may be formed of alloy which is made of noble metal or is mainly made of noble metal.

This makes it possible to obtain the reinforcing member having excellent corrosion resistance.

In addition to the above, in the reinforcing member for the printed wiring board of the present invention, the noble metal may be gold or palladium.

This makes it possible to obtain the reinforcing member which has extremely good corrosion resistance. Furthermore, the electrical conduction is achieved with a lower electric resistance than that of the metal base.

In addition to the above, in the reinforcing member for the printed wiring board of the present invention, the metal base may be formed of stainless steel.

This makes it easy to cause the reinforcing member to have at least predetermined strength.

In addition to the above, the reinforcing member for the printed wiring board of the present invention may further include a conductive composition layer which is provided on the one surface side of the metal base.

With this, the printed wiring board is easily adhered on account of the inclusion of the conductive composition layer.

In addition to the above, in the reinforcing member for the printed wiring board of the present invention, the surface layer may be formed not only on the other surface side but also on the one surface side of the metal base.

With this, because not only the one surface but also the other surface of the base are covered with the surface layer, the reinforcing member having excellent corrosion resistance is obtained.

In addition to the above, in the reinforcing member for the printed wiring board of the present invention, the surface layer may be an assembly of lines and/or dots.

With this, the material cost is reduced as compared to cases where the surface layer is formed on the entire surface of the metal base.

A printed wiring board of the present invention includes: a base member; a ground wiring pattern formed on the base member; and the above-described reinforcing member which is disposed opposite to a predetermined part of the ground wiring pattern.

According to this configuration, when the reinforcing member for the printed wiring board is adhered to the printed wiring board, the predetermined part of the ground wiring pattern of the printed wiring board is reinforced mainly by the metal base, and the predetermined part of this ground wiring pattern is in electrical conduction with the external ground member.

In regard to the above, because the surface layer have higher corrosion resistance than the base, the speed of the generation of a passive film on the reinforcing member due to external circumstances such as temperature and moisture after the reinforcing member is pasted onto the printed wiring board, aged deterioration, or the like slows down as compared to cases where the reinforcing member is formed solely of the metal base. This prevents the electric resistance of the reinforcing member from becoming high on account of a passive film on the reinforcing member and therefore prevents the ground effect of the printed wiring board from being deteriorated. This makes it possible to obtain the printed wiring board in which the ground effect is not deteriorated and the ground effect of the printed wiring board is maintained over a long period of time.

In addition to the above, because the surface layer has higher conductivity than the metal base, the reinforcing member and the external ground member are in electrical conduction with each other with a lower electric resistance than in cases where the reinforcing member is formed solely of the metal base. This makes it possible to obtain the printed wiring board including the reinforcing member with a high ground effect.

Furthermore, because the metal base is protected from the external environment by the surface layer, options of the metal base is increased. With this, the reinforcing member for the printed wiring board is suitably configured in accordance with the specification of the reinforcement and the cost.

In addition to the above, to solve the problem above, a reinforcing member for a flexible printed wiring board of the present invention may be configured as below. That is to say, in a shield printed wiring board in which a shield film including an insulating layer provided on an insulating film of a printed wiring board and a conductive layer formed below the insulating layer, a reinforcing member for a flexible printed wiring board may include one surface provided on the insulating layer of the shield film opposing a mounting position of an electronic component and the other surface in electrical conduction with an external ground member. The reinforcing member may include a metal base which is conductive; and a surface layer which is formed on a surface of the metal base to constitute at least a part of the other surface; the surface layer may have higher conductivity and corrosion resistance than the metal base, the surface layer may be 0.004 to 0.2 μm thick; the reinforcing member may be adhered to the insulating layer of the shield film at the one surface by conductive composition formed on the one surface of the reinforcing member, as conductive particles included in the conductive composition penetrate the insulating layer of the shield film and are in contact with the conductive layer. Effects similar to those of the configuration above are achieved with this configuration.

DESCRIPTION OF EMBODIMENTS

The following will describe a preferred embodiment of the present invention with reference to figures.

(Overall Structure of Printed Wiring Board 1)

To begin with, a printed wiring board 1 of an embodiment will be described with reference to FIG. 1. The printed wiring board 1 of the embodiment is a flexible printed wiring board which is flexible and bendable. This flexible printed wiring board may be used as a rigid-flexible wiring board into which a flexible printed wiring board and a rigid board are integrated.

Figure 1:
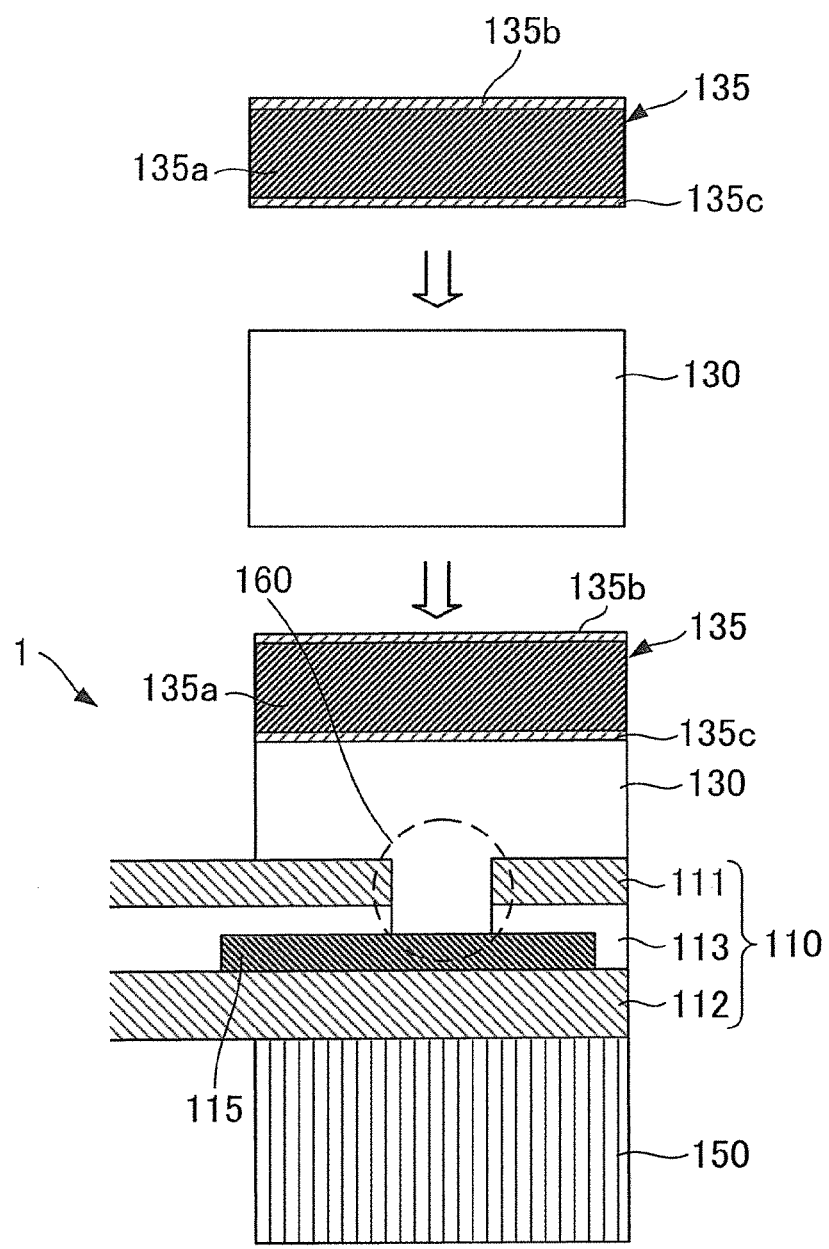
FIG. 1 is a partial cross section of a printed wiring board of an embodiment.

As shown in FIG. 1, the printed wiring board 1 includes a printed wiring board main body 110, a conductive composition layer 130, and a reinforcing member 135. To a mounting position on the lower surface of the printed wiring board main body 110 is connected an electronic component 150.

The reinforcing member 135 is disposed opposite to a predetermined part of a ground wiring pattern 115 in the printed wiring board main body 110, and the reinforcing member 135 therefore reinforces a mounting position of the electronic component 150. Furthermore, a surface (a lower surface 135c in FIG. 1) of the reinforcing member 135 opposing the predetermined part of the ground wiring pattern 115 is in electrical conduction with the predetermined part of the ground wiring pattern 115 via the conductive composition layer 130. In this way, the ground wiring pattern 115 is in electrical connection with the reinforcing member 135.

In addition to the above, the reinforcing member 135 is, at the other surface (an upper surface 135b in FIG. 1), in electrical conduction with an external ground member (not illustrated) at a ground potential. This allows the ground wiring pattern 115 to be grounded to the external ground member via the reinforcing member 135. The external ground member is, for example, a housing of an electronic devices (not illustrated). Because the ground wiring pattern 115 is in electrical conduction with the external ground member via the reinforcing member 135, the ground effect is enhanced.

The reinforcing member 135 includes a base 135a (metal base) which is conductive and formed of metal and surface layers 135b and 135c formed on surfaces of the base 135a. Because the surfaces of the base 135a are covered with the surface layers 135b and 135c in this way, the connection area of the base 135a in contact with the outside air is decreased, and the generation of a passive film on the base 135a is effectively prevented. Furthermore, the surface layers 135b and 135c are configured to have higher conductivity and corrosion resistance than the base 135a. This prevents the corrosion of the surface layers 135b and 135c. Moreover, because the surface layers 135b and 135c have better conductivity and corrosion resistance than the base 135a, a low electric resistance may be maintained for a long time as compared to cases where the reinforcing member 135 is formed solely of the base 135a.

Because the reinforcing member 135 is formed as above, it is possible to prevent an increase in the electric resistance due to the generation of a passive film on the reinforcing member 135 under the process of manufacturing the printed wiring board 1 or aged deterioration of the printed wiring board 1. With this, the electromagnetic wave shielding effect and the ground effect of the printed wiring board 1 are maintained for a long time.

Each configuration will be specifically described.
(Printed Wiring Board Main Body 110)

The printed wiring board main body 110 includes a base member 112 on which wiring patterns such as an unillustrated signal wiring pattern and the ground wiring pattern 115 are formed, an adhesive layer 113 provided on the base member 112, and an insulating film 111 adhered to the adhesive layer 113.

The unillustrated signal wiring pattern and the ground wiring pattern 115 are formed on the upper surface of the base member 112. These wiring patterns are formed by etching conductive material. Among the wiring patterns, the ground wiring pattern 115 is a pattern which is maintained at the ground potential.

The adhesive layer 113 is an adhesive provided between the insulating film 111 and the wiring patterns such as the signal wiring pattern and the ground wiring pattern 115. This adhesive layer 113 has functions of maintaining insulation and causing the insulating film 111 to be adhered to the base member 112. The adhesive layer 113 is 10 µm to 40 µm in thickness, but the thickness of this layer is not particularly limited and may be accordingly set.

Both of the base member 112 and the insulating film 111 are made of engineering plastics. Examples of the engineering plastics include resins such as polyethylene terephthalate, polypropylene, cross-linked polyethylene, polyester, polybenzimidazole, polyimide, polyimidoamide, polyetherimide, and polyphenylene sulfide. When heat resistance is not required so much, a polyester film is preferred for its inexpensiveness. When fire retardance is required, a polyphenylene sulfide film is preferred. When heat resistance is required, a polyimide film, a polyamide film, or a glass epoxy film is preferred. The base member 112 is 10 µm to 40 µm in thickness and the insulating film 111 is 10 µm to 30 µm in thickness, but the thickness of above-mentioned is not particularly limited and may be accordingly set.

The insulating film 111 and the adhesive layer 113 are provided with a hole part 160 made by mental mold or the like. The hole part 160 causes a part of a wiring pattern selected from the wiring patterns such as the signal wiring pattern and the ground wiring pattern to be exposed. In the present embodiment, the hole part 160 is provided to extend in a direction in which the insulating film 111 and the adhesive layer 113 are stacked, so that a part of the ground wiring pattern 115 is exposed to the outside. The diameter of the hole part 160 is suitably configured so as not to expose a neighboring wiring pattern.
(Reinforcing Member 135)

Figure 3:
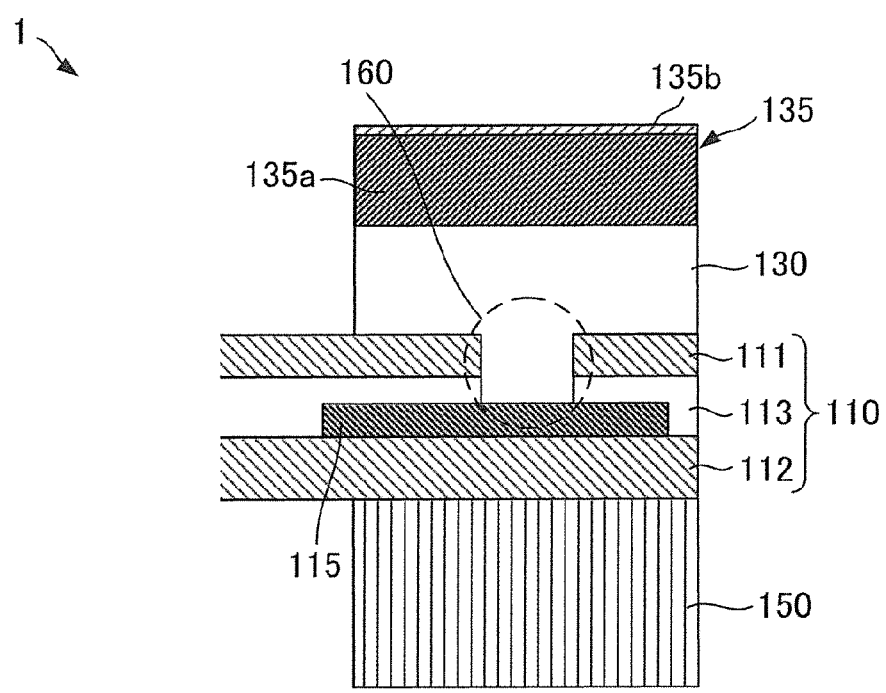
FIG. 3 is a partial cross section of a printed wiring board of another modification of the embodiment.

The reinforcing member 135 includes a base 135a which is conductive and is made of metal, and surface layers 135b and 135c which are formed on one surface (lower surface) and the other surface (upper surface) of the base 135a, respectively. In the present embodiment the surface layers 135b and 135c are formed on the upper surface and the lower surface of the base 135a, respectively, but it is not limited to this. As shown in FIG. 3, the surface layer 135c may not be formed on the lower surface, and the surface layer 135b is formed only on the upper surface of the base 135a.
(Reinforcing Member 135: Base 135a)

In the present embodiment, the base 135a is formed of stainless steel, and hence the reinforcing member 135 has high strength. While the base 135a is preferably formed of stainless steel for reasons such as the corrosion resistance and the strength, it is not limited to this. The base 135a may be made of other types of metal. For example, the base 135a may be made of nickel, copper, silver, tin, gold, palladium, aluminum, chromium, titanium, zinc, or alloy including at least one of these materials.

The lower limit of the thickness of the base 135a is preferably 0.05 mm or more, and more preferably 0.1 mm or more. The upper limit of the thickness of the base 135a is preferably 1.0 mm or less, and more preferably 0.3 mm or less. The thickness of the base 135a is not particularly limited and may be accordingly set.
(Reinforcing Member 135: Surface Layers 135b and 135c)

The surface layers 135b and 135c are made of noble metal. On this account, the reinforcing member 135 has high conductivity and corrosion resistance as compared to cases where the reinforcing member 135 is formed solely of the base 135a made of stainless steel. Examples of the noble metal of which the surface layers 135b and 135c are made include gold (Au), silver (Ag), platinum (Pt), palladium (Pd), rhodium (Rh), iridium (Ir), ruthenium (Ru), and osmium (Os). In the present embodiment, the noble metal is gold. Alternatively, the surface layers 135b and 135c may be formed of alloy mainly made of noble metal.

While in the present embodiment the surface layers 135b and 135c are formed of noble metal or alloy mainly made of noble metal, it is not limited to this. The surface layers 135b and 135c may be made of any material on condition that the material has higher conductivity and corrosion resistance than the material of the base 135a.

Because the surface layers 135b and 135c have higher corrosion resistance than the base 135a, the speed of the generation of a passive film on the reinforcing member 135 due to external circumstances such as temperature and moisture after the reinforcing member 135 is pasted onto the printed wiring board 1, aged deterioration, or the like slows down as compared to cases where the reinforcing member 135 is formed solely of the base 135a. This prevents the electric resistance of the reinforcing member 135 from becoming high on account of a passive film on the reinforcing member 135, and makes it possible to maintain the ground effect of the printed wiring board 1 for a long time.

Furthermore, because the surface layers 135b and 135c have higher conductivity than the base 135a, the external ground member (not illustrated) connected to the upper surface of the surface layer 135b and the reinforcing member 135 are in electrical conduction at a lower electric resistance than in cases where the reinforcing member 135 is formed solely of the base 135a.

Figure 5:
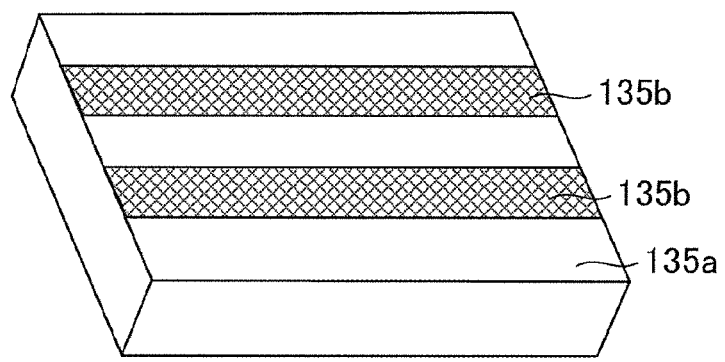
FIG. 5 is an oblique perspective of a reinforcing member of another modification of the embodiment.
Figure 6:
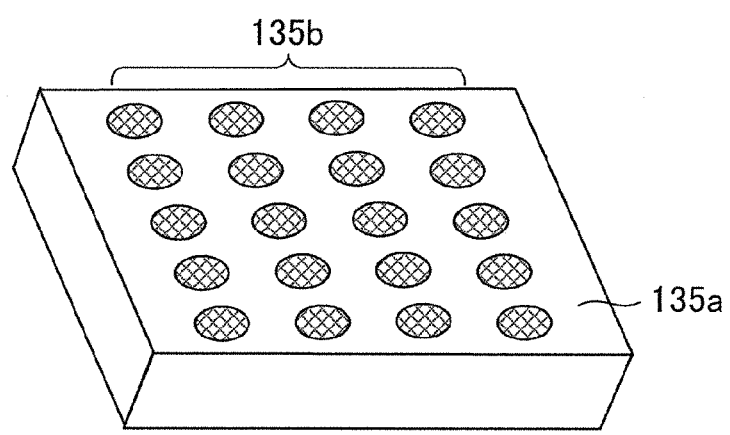
FIG. 6 is an oblique perspective of a reinforcing member of another modification of the embodiment.

The surface layers 135b and 135c may not be formed over the entire upper surface or lower surface of the base 135a, but may be partially formed. For example, each of the surface layers 135b and 135c may be an assembly of lines and/or dots. In this regard, examples of the assembly of lines include stripes and a lattice, whereas an example of assembly of dots is dots or the like. To specifically describe the assembly of lines, for example, as shown in FIG. 5, multiple line-shaped surface layer 135b is lined up in parallel on the base 135a. To specifically describe the assembly of dots, for example, as shown in FIG. 6, multiple dot-shaped surface layer 135b is provided in a dispersed manner on the base 135a.

The surface layers 135b and 135c are preferably formed by electrolytic plating. For example, the surface layers 135b and 135c are formed by immersing a large-sized base 135a into a plating bath, and then the base 135a is cut in vertical and lateral directions into pieces with predetermined dimension, together with the surface layers 135b and 135c. As a result, plural reinforcing members 135 are obtained. Instead of the plating, the surface layers 135b and 135c may be formed by deposition or the like.

The lower limit of the thickness of surface layers 135b and 135c is preferably 0.004 μm or more, and more preferably 0.005 μm or more, in consideration of sufficient corrosion resistance of the reinforcing member 135. The upper limit of the thickness of surface layers 135b and 135c is preferably 0.5 μm or less, more preferably 0.2 μm or less, in consideration of the cost and close-contactness between the reinforcing member 135 and the conductive composition layer 130. When the upper limit of the thickness of each of the surface layers 135b and 135c is 0.5 μm or less, close-contactness between the reinforcing member 135 and the conductive composition layer 130 is sufficiently achieved.

(Conductive Composition Layer 130)

The conductive composition layer 130 is formed of a composition which exhibits either isotropic or anisotropic conductivity. In an isotropic conductive adhesive, conductivity is identical between thickness direction and plane direction in the same manner as in known solder. On this account, when the conductive composition layer 130 is formed of the isotropic conductive adhesive, a conductive state is achieved in all three-dimensional directions constituted by thickness direction, width direction, and longitudinal direction. On the other hand, when the conductive composition layer 130 is formed by the anisotropic conductive adhesive, a conductive state is achieved in only two-dimensional direction constituted by thickness direction, because the conductive composition layer exhibits different conductivities in thickness direction and plane direction.

The conductive composition may be formed of a thermosetting resin composition, or a thermoplastic resin composition and conductive particles. As thermosetting resin composition, for example, phenol resin, epoxy resin, urethane resin, melamine resin, alkyd resin or the like is preferably used. Thermosetting resin composition may be composed of at least one type of said thermosetting composition. As thermoplastic resin composition, polystyrene resin, vinyl acetate resin, polyester resin, polyethylene resin, polypropylene resin, polyamide resin, rubber resin, acrylic resin is preferably used. Thermoplastic resin compositions may be composed of at least one type of said thermoplastic resin composition. In addition to the conductive particles, hardening accelerator, tackifier, antioxidant, pigment, dye, plasticizer, ultraviolet absorber, antifoaming agent, leveling agent, filler, flame retardant, viscosity control agent or the like may be added to the resin composition if necessary.

As the conductive composition including the thermosetting resin composition or the thermoplastic resin composition and the conductive particles, for example, conductive paste, conductive adhesive, and conductive pressure-sensitive adhesive or the like may be listed. That is to say, whatever can secure electrical conduction between the reinforcing member for the printed wiring board and the ground wiring pattern while fixing the reinforcing member for the printed wiring board to the predetermined part of the ground wiring pattern may be the conductive composition in the present invention.

The material of the conductive particles is not particularly limited. Examples of the material include carbon powder, silver powder, copper powder, nickel powder, solder powder, aluminum powder, silver-coated copper filler formed by silver-plating copper powder, filler formed by metal-plating resin balls or glass beads, and a mixture of any of above. The shape of each of the conductive particles is not particularly limited, and is suitably selected from spherical, flat, squamous, dendrite-shaped, fiber-shaped, and the like. The diameter of each of the conductive particles is not particularly limited, but is required to fall within the range of 1 to 50 μm.

The amount of the conductive particles is not particularly limited; when the conductive composition is conductive paste, the amount of the conductive particles is 70 to 95 percent by weight in the conductive composition, and when the conductive composition is conductive adhesive or conductive pressure-sensitive adhesive, the amount of the conductive particles is 5 to 70 percent by weight in the conductive composition.

The conductive particles may be made of low melting metal which is formed of at least two components, then forms alloy when molten, and the re-melting temperature of the alloy is higher than the melting point of the metal before molten. Because the melting point of the conductive particles is low, the conductive particles are molten and adhered at a temperature which is low enough not to damage components or the like of the printed wiring board 110 while the conductive composition layer 130 is thermally pressed onto and adhered with the printed wiring board 110. Furthermore, when the conductive particles are cooled and solidified after molten, the conductive particles are alloyed and the re-melting point of the conductive particles has become higher than the melting point of the metal before molten. On this account, the solidified conductive particles after heated are less likely to be re-molten even if the conductive composition is exposed to a high-temperature environment.

(Attaching Reinforcing Member 135 to Printed Wiring Board Main Body 110)

With reference to FIG. 1, the way how the reinforcing member 135 is attached to the printed wiring board main body 110 will be described. To begin with, a reinforcing member 135 in which surface layers 135b and 135c are formed on the upper surface and the lower surface of a base 135a is prepared. Then a conductive composition layer 130 is provided on the lower surface of the reinforcing member 135.

Subsequently, the reinforcing member 135 is provided on the printed wiring board main body 110 so that the conductive composition layer 130 side is on the hole part 160. Then the reinforcing member 135 and the printed wiring board main body 110 are sandwiched in up-down directions between two heating plates at a predetermined temperature (e.g., 120 degrees centigrade), and are pressed for a short time (e.g., five seconds) with a predetermined pressure (0.5 MPa). With this, the reinforcing member 135 is tentatively joined with the printed wiring board main body 110.

Subsequently, the two heating plates are heated to a predetermined temperature (170 degrees centigrade) which is higher than the temperature in the tentative joining state above, and the reinforcing member 135 and the printed wiring board main body 110 are sandwiched between these heating plates and pressed for a predetermined time (e.g., 30 minutes) with a predetermined pressure (3 MPa). With this, as shown in FIG. 1, the reinforcing member 135 is fixedly attached to the printed wiring board main body 110 while the hole part 160 is filled with the conductive composition layer 130.

As described above, because thermal treatment is conducted when the reinforcing member 135 is attached to the printed wiring board main body 110, electric resistance is increased due to the generation of a passive film on the reinforcing member 135 if the corrosion resistance of the reinforcing member 135 is low. In this regard, in the present embodiment, because the surface layers 135b and 135c are formed on the surfaces of the base 135a of the reinforcing member 135, the generation of a passive film on the reinforcing member due to the thermal treatment in the process of manufacturing the printed wiring board 1 is prevented.

Figure 4:
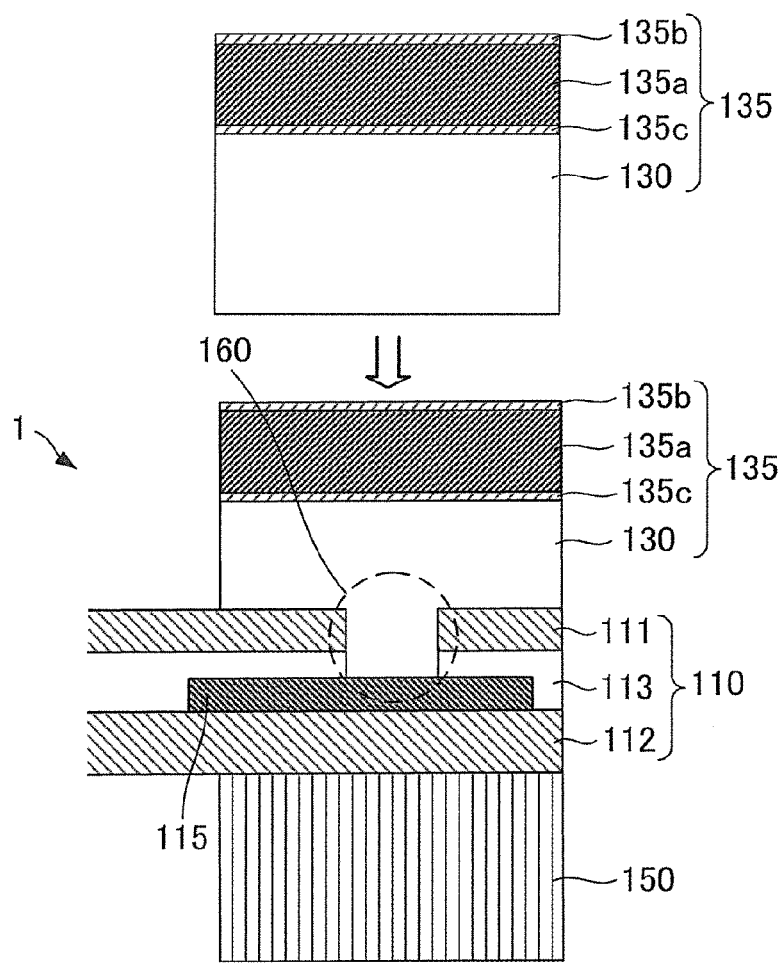
FIG. 4 is a partial cross section of a printed wiring board of another modification of the embodiment.

While in the present embodiment the conductive composition layer 130 is not included in the reinforcing member 135, the conductive composition layer 130 may be included in the reinforcing member 135 as shown in FIG. 4. In this case, because the reinforcing member 135 includes the conductive composition layer 130 in a distribution stage, a step of attaching the conductive composition layer 130 to the reinforcing member 135 is unnecessary when the reinforcing member 135 is attached to the printed wiring board main body 110, and hence the reinforcing member 135 is easily attached to the printed wiring board main body 110.

For example, the reinforcing member 135 shown in FIG. 4 is formed in such a way that surface layers 135b and 135c are formed by immersing a large-sized base 135a into a plating bath, and then a conductive composition layer 130 is pasted onto the lower surface or the lower surface is coated with the conductive composition layer 130. As the large-sized reinforcing member 135 configured in this way is cut in vertical and lateral directions into pieces with predetermined dimensions, therefore plural reinforcing members 135 are obtained.

Figure 2:
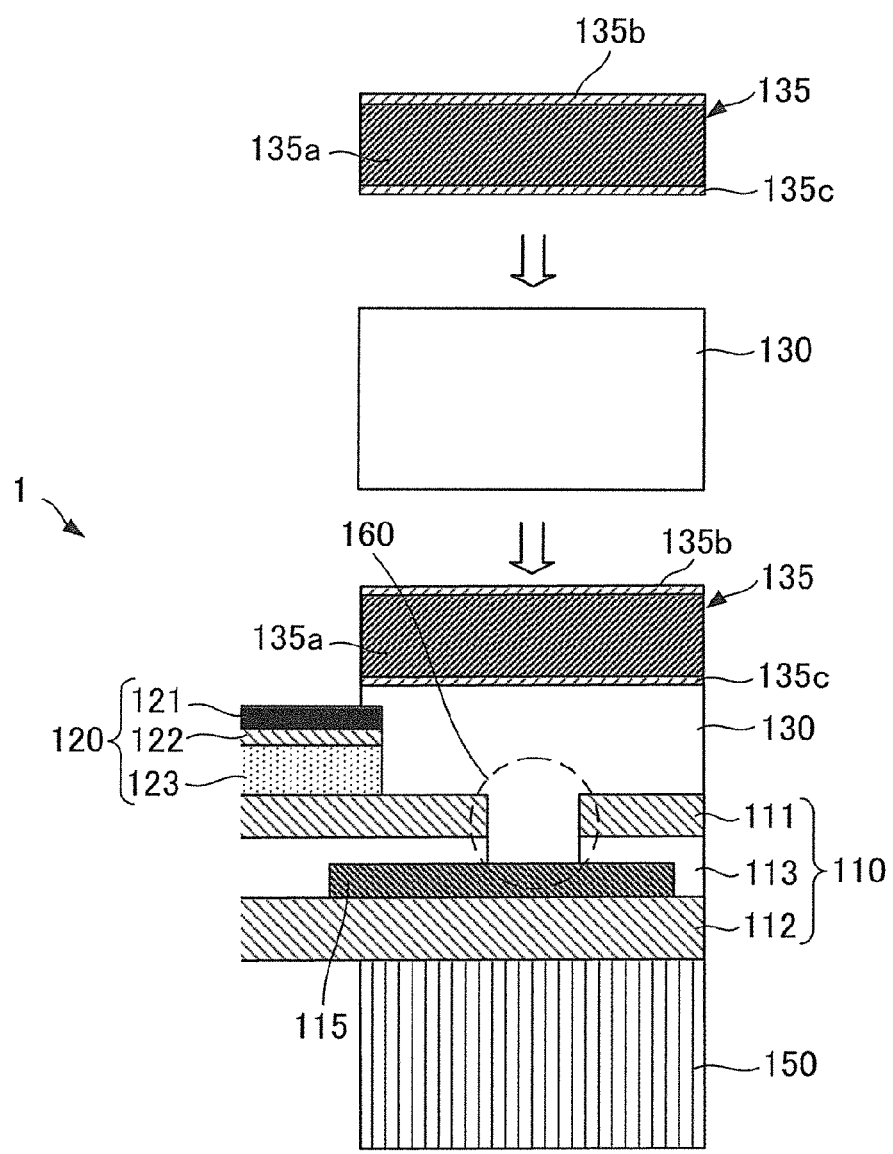
FIG. 2 is a partial cross section of a printed wiring board of a modification of the embodiment.

The detailed description of the present invention provided hereinabove mainly focused on characteristics thereof for the purpose of easier understanding; however, the scope of the present invention shall be construed as broadly as possible, encompassing various forms of other possible embodiments, and therefore the present invention shall not be limited to the above description. For example, while the printed wiring board 1 of the embodiment does not include a film 120, the printed wiring board 1 may include the film 120 as shown in FIG. 2. Now, the film 120 of the modification will be described.

(Structure of Film 120 of Modification)

As shown in FIG. 2, the film 120 includes a conductive member 123 provided on an insulating film 111, a conductive layer 122 adhered to the conductive member 123 in a contact manner, and an insulating layer 121 provided on the conductive layer 122. The film 120 includes the conductive layer 122 and therefore has a function of shielding electromagnetic waves.

The conductive member 123 is formed of an adhesive which exhibits either isotropic or anisotropic conductivity. The isotropic conductive adhesive has same electric characteristics with those of solders. For this reason, when the conductive member 123 is formed of the isotropic conductive adhesive, a conductive state is achieved in all three-dimensional directions constituted by thickness direction, width direction, and longitudinal direction. On the other hand, when the conductive member 123 is formed by the anisotropic conductive adhesive, a conductive state is achieved in only two-dimensional directions constituted by thickness direction. When the conductive member 123 is formed of an isotropic conductive adhesive, the conductive member 123 has the function of the conductive layer 122 and hence the conductive layer 122 may not be required. In other words, when conductive layer 122 is not provided, the conductive member 123 perform the same function as the conductive layer 122.

In addition to the above, the conductive member 123 is formed at least of an adhesive and conductive particles dispersed in the adhesive. To be more specific, the adhesive is composed of adhesive resin such as thermoplastic resin or thermosetting resin. As thermoplastic resin, polystyrene resin, vinyl acetate resin, polyester resin, polyethylene resin, polypropylene resin, polyamide resin, rubber resin, and acrylic resin may be used. As thermosetting resin, phenol resin, epoxy resin, urethane resin, melamine resin, and alkyd resin may be used. To the adhesive resin, conductive particles such as metal particles and carbon particles or the like may be added, so that the conductive adhesive with conductivity may be obtained. When heat resistance is not required so much, polyester thermoplastic resin not restricted in storage conditions is preferable. When heat resistance is required, epoxy thermosetting resin which is good in reliability is preferable. In both cases, less effusion (resin flow) in thermal pressing is preferred in degree. While the conductive member 123 is 3 µm to 30 µm thick, the thickness of this member is not particularly limited and may be suitably set.

The conductive layer 122 has a shielding effect of shielding noise such as unwanted radiation from an electric signal from the main substrate and electromagnetic waves from the outside. The conductive layer 122 is formed of anyone of nickel, copper, silver, tin, gold, palladium, aluminum, chromium, titanium, zinc, or an alloy of at least two of them. The thickness of the conductive layer 122 is suitably determined in accordance with the desired shielding effect and resistance to repeated bending and sliding. The thickness of the conductive layer 122 is preferably 0.01 µm to 10 µm. When the thickness is less than 0.01 µm, the shielding effect may be insufficient. When the thickness exceeds 10 µm, the bendability may become insufficient. Examples of the method of forming the conductive layer 122 include vacuum deposition, sputtering, CVD, MO (Metal Organic), plating, foil formation, a method of obtaining a metal layer by baking a resin composition including metal fine particles, and a method of obtaining a metal layer by baking a solution including metal fine particles. Among these methods, vacuum deposition is preferable in consideration of mass production so that inexpensive and stable conductive layer 122 may be obtained. As described above, when the conductive member 123 is formed of the isotropic conductive adhesive, the conductive layer 122 may not be provided.

The insulating layer 121 is formed of resin such as epoxy resin, polyester resin, acrylic resin, phenol resin, and urethane resin, or a mixture of any of these resins, and have functions of maintaining insulation and covering the conductive layer 122 to prevent the conductive layer 122 from being exposed to the outside. The thickness of the insulating layer 121 is 1 µm to 10 µm, but is not particularly limited to this range and may be suitably set.

Figure 7:
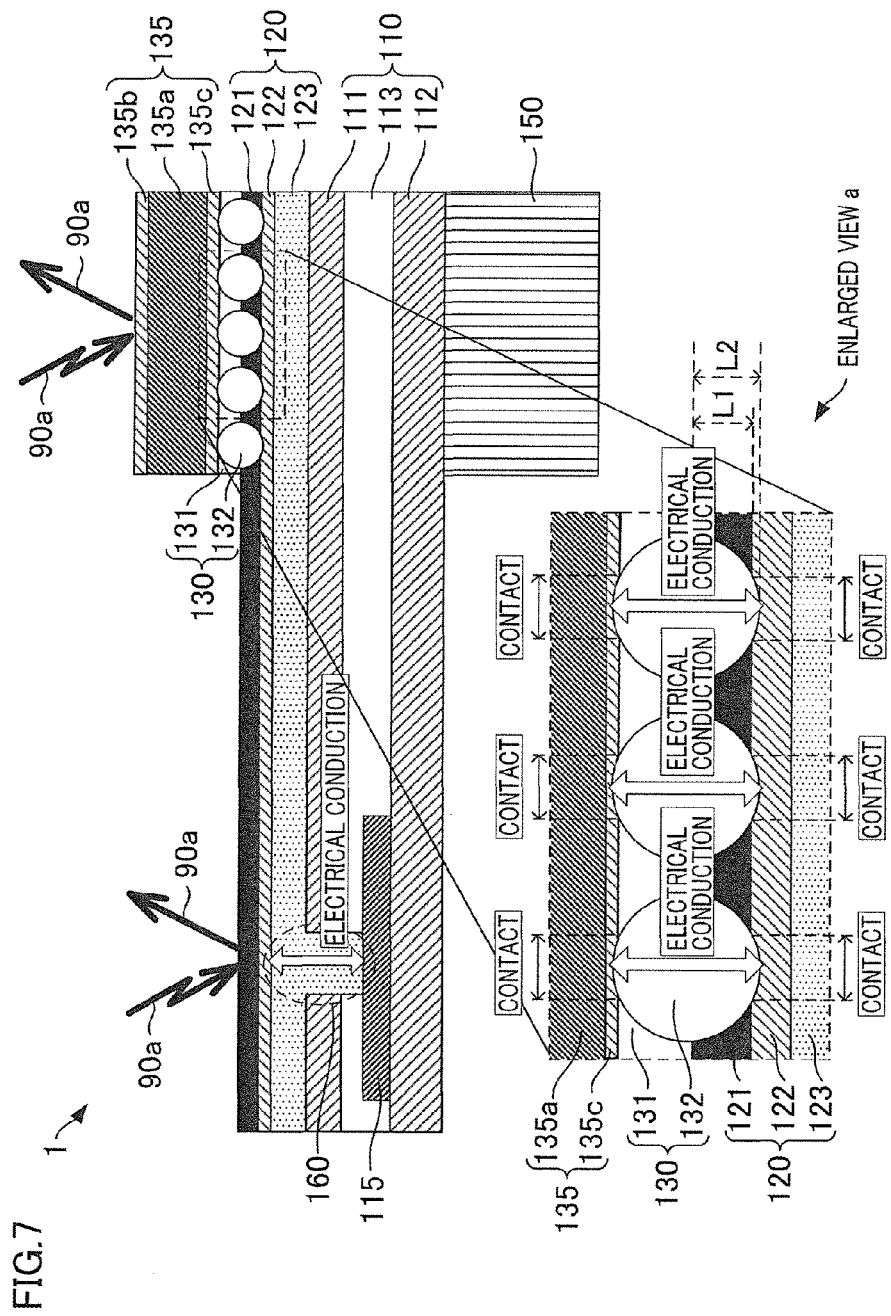
FIG. 7 is a partial cross section of a printed wiring board of another modification of the embodiment.

In the printed wiring board 1 of the modification shown in FIG. 2, the film 120 is provided to cover a part of an area on the insulating film 111 corresponding to the reinforcing plate 135. As such, in the printed wiring board, the film 120 is not required to cover the entirety of the area on the insulating film 111 corresponding to the reinforcing plate 135. Having said that, as shown in FIG. 7, a film 120 may be provided to cover an area on the insulating film 111 corresponding to the reinforcing plate 135. The following will describe a printed wiring board 1 of another modification of the embodiment shown in FIG. 7. in FIG. 7.

(Overall Structure of Printed Wiring Board 1 of another Modification)

As shown in FIG. 7, a printed wiring board 1 includes a printed wiring board main body 110, a film 120, and a reinforcing member 135. To a mounting position formed on the lower surface of the printed wiring board main body 110, an electronic component 150 is connected. The film 120 is provided on the printed wiring board main body 110 to reach the area where the reinforcing plate 135 is provided.

In addition to the above, the reinforcing member 135 is provided on the film 120 to oppose the mounting position to which the electronic component 150 is connected. The reinforcing member 135 is adhered to the conductive composition layer 130 in a contact manner, and is pasted onto the insulating layer 121 of the film 120 by the conductive composition layer 130 of the reinforcing member 135. An enlarged view a in FIG. 7 shows how the conductive composition layer 130 adhered to the reinforcing member 135 in a contact manner is adhered to the insulating layer 121 of the film 120. As shown in the enlarged view a, the conductive particles 132 included in the conductive composition layer 130 protrude from the adhesive 131 in the conductive composition layer 130. The reinforcing member 135 adhered to the upper surface of the conductive composition layer 130 in a contact manner is in contact with the conductive particles 132. In the meanwhile, the conductive particles 132 protruding from the lower surface of the conductive composition layer 130 penetrate the insulating layer 121 of the film 120 and are in contact with the conductive layer 122 below the insulating layer 121. With this, the reinforcing member 135 is in electrical conduction with the conductive layer 122 of the film 120 via the conductive particles 132 of the conductive composition layer 130. As the conductive layer 122 is connected with the ground wiring pattern 115 via the conductive member 123, the reinforcing member 135, the conductive layer 122, and the ground wiring pattern 115 which are conductive may be at the same electric potential. Furthermore, the ground effect is improved as the reinforcing member 135 is connected with a housing which is an external ground member. Furthermore, the reinforcing member 135 which is conductive may become to have the shielding effect.

As described above, when the conductive member 123 is formed of an isotropic conductive adhesive, the conductive layer 122 may not be provided. When the conductive member 123 is formed of the isotropic conductive adhesive and the conductive layer 122 is not provided, the conductive particles 132 are in electrical conduction with the conductive member 123 as the particles 132 are in contact with the conductive member 123.

As the conductive member 123 is in electrical conduction with the ground wiring pattern 115, the reinforcing member 135, the conductive member 123, and the ground wiring pattern 115 which are conductive are at the same electric potential. Furthermore, the ground effect is improved as the reinforcing member 135 is connected with the housing which is an external ground member. Furthermore, the reinforcing member 135 which is conductive may become to have the shielding effect.

As described above, the reinforcing member 135 of the printed wiring board 1 has at least a function of reinforcing the mounting position of the electronic component 150, a function of shielding noise such as the electromagnetic wave 90a from the outside to the mounting position of the electronic component 150, and a function of connection with the ground wiring pattern and the external ground, respectively.

In the embodiment shown in FIG. 1 the ground wiring pattern 115 and the hole part 160 are formed above the mounting position of the electronic component 150. In the modification shown in FIG. 7 the ground wiring pattern 115 and the hole part 160 are formed at positions not above the mounting position of the electronic component 150. As the modification shown in FIG. 7, the ground wiring pattern 115 and the hole part 160 may be formed above the mounting position of the electronic component 150, or the ground wiring pattern 115 and the hole part 160 may not be formed. In such a case, the printed wiring board 1 is connected with the external ground only by the reinforcing member 135.

Further, the terms and phraseology used in the present specification are adopted solely to provide specific illustration of the present invention, and in no case should the scope of the present invention be limited by such terms and phraseology. Further, it will be obvious to those skilled in the art that the other structures, systems, methods and the like are possible, within the spirit of the invention described in the present specification. The description of claims therefore shall encompass structures equivalent to the present invention, unless otherwise such structures are regarded as to depart from the spirit and scope of the present invention. To fully understand the object and effects of the present invention, it is strongly encouraged to sufficiently refer to disclosures of documents already made available.

EXAMPLES (Test 1)

Figure 8:
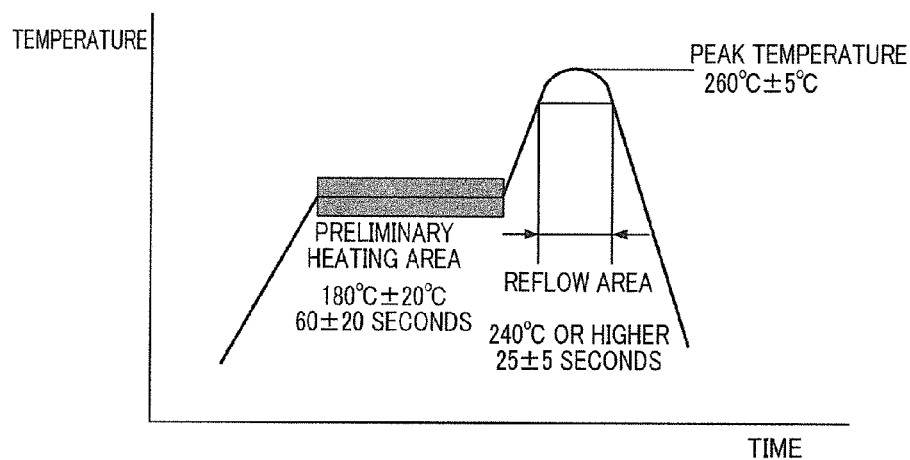
FIG. 8 shows reflow profile in an example.
Figure 9:
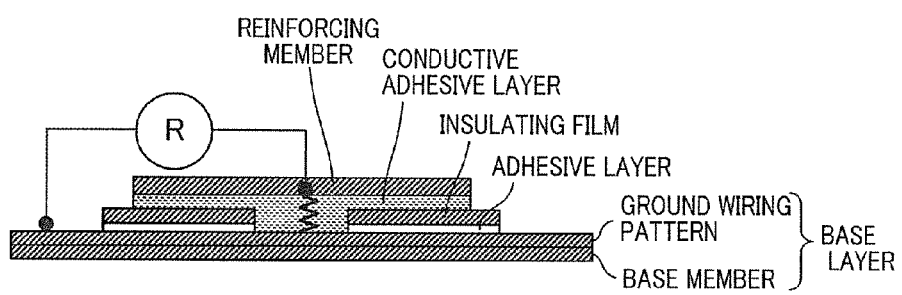
FIG. 9 shows a method of measuring an electric resistance between the reinforcing member and the base member in the example.

To measure to what extent the electric resistance of the reinforcing member was increased due to an influence of thermal treatment in the process of manufacturing the printed wiring board and in the attachment of the electronic component to the printed wiring board, the printed wiring board to which the reinforcing member was fixed was baked (heated) for an hour at 135 degrees centigrade, and then reflow of the printed wiring board was conducted five times to attach the electronic component. As shown in FIG. 8, the reflow profile was set such that the printed wiring board was heated typically at 180±20 degrees centigrade for 60±20 seconds, and then the printed wiring board was heated for 25±5 seconds and at 240 degrees centigrade or higher, 260±5 degrees centigrade at a peak period. As shown in FIG. 9, the electric resistance (Ω) between the reinforcing member and the base layer (which is a combination of the base member and the ground wiring pattern) was measured six times in total, i.e., in an initial state in which no thermal treatment had been done, in a state after baking was done for an hour at 135 degrees centigrade, in a state after conducting the reflow once, in a state after conducting reflow twice, in a state after conducting the reflow three times, and in a state after conducting the reflow five times. The measurement results are shown in Table 1.

As shown in Table 1, in Test 1, electrolytic plating was conducted for a base made from SUS 304 to form a reinforcing member, and an electric resistance between the reinforcing member on which a gold surface layer 0.02 µm thick was formed and a base layer was measured as Example A. Electrolytic plating was conducted for a base made from SUS 304 to form a reinforcing member, and an electric resistance between the reinforcing member on which a gold surface layer 0.20 µm thick was formed and a base layer was measured as Example B. Electrolytic plating was conducted for a base made from SUS 304 to form a reinforcing member, and an electric resistance between the reinforcing member on which a palladium surface layer 0.02 µm thick was formed and a base layer was measured as Example C. Electrolytic plating was conducted for a base made from SUS 304 to forma reinforcing member, and an electric resistance between the reinforcing member on which a palladium surface layer 0.20 µm thick was formed and a base layer was measured as Example D.

Furthermore, in Table 1, an electric resistance between a reinforcing member, which was formed solely of a base made from SUS 304 and no surface layer was formed thereon, and a base layer was measured as Comparative Example E. Furthermore, electrolytic plating was conducted for a base made from SUS 304 to form a reinforcing member, and an electric resistance between the reinforcing member on which a nickel surface layer 2 µm thick was formed and a base layer was measured as Comparative Example F.

In Examples A to D and Comparative Examples E and F, the base member (25 µm) was made of PI (polyimide), and the ground wiring pattern was made of Cu (18 µm). The thickness of the base layer which is a combination of the base member and the ground wiring pattern was 43 µm. The insulating film (12.5 µm) was made of PI, and an adhesive member (25 µm) was a thermosetting adhesive. The total thickness of the insulating film and the adhesive member was 37.5 µm. The conductive adhesive layer for the adhesion of the reinforcing member was CBF-300-W6 made by Tatsuta Electric Wire & Cable Co., Ltd. The hole part formed through the insulating film and the adhesive member was circular in shape and 1.0 mm in diameter in a top view.

The electric resistance between the reinforcing member and the base layer was measured as shown in FIG. 9 by fixing the load at 0.5N, by using a variable-load contact resistance measurement device made by YAMASAKI SEIKI KENKYUSHO Inc.

TABLE 1

| | CONFIGURATION OF REINFORCING MEMBER | INITIAL STATE | BAKING AT 135° C. AND FOR AN HOUR | FIRST REFLOW | SECOND REFLOW | THIRD REFLOW | FOURTH REFLOW |
|---|---|---|---|---|---|---|---|
| EXAMPLE A | SUS304 + Au0.02 µm PLATING | 0.008 Ω | 0.012 Ω | 0.017 Ω | 0.020 Ω | 0.023 Ω | 0.026 Ω |
| EXAMPLE B | SUS304 + Au0.20 µm PLATING | 0.008 Ω | 0.011 Ω | 0.012 Ω | 0.016 Ω | 0.016 Ω | 0.016 Ω |
| EXAMPLE C | SUS304 + Pd0.02 µm PLATING | 0.009 Ω | 0.017 Ω | 0.018 Ω | 0.019 Ω | 0.020 Ω | 0.022 Ω |
| EXAMPLE D | SUS304 + Pd0.20 µm PLATING | 0.011 Ω | 0.019 Ω | 0.022 Ω | 0.021 Ω | 0.021 Ω | 0.029 Ω |
| COMPARATIVE EXAMPLE E | SUS304 | 0.142 Ω | 0.475 Ω | 1.039 Ω | 1.439 Ω | 1.841 Ω | 2.401 Ω |
| COMPARATIVE EXAMPLE F | SUS304 + Ni2 µm PLATING | 0.031 Ω | 0.089 Ω | 0.143 Ω | 0.146 Ω | 0.140 Ω | 0.130 Ω |

(Comparison between Examples A to D and Comparative Examples E and F)

As shown in Table 1, the degree of increase in the electric resistance between the reinforcing member and the base layer in each of Examples A to D after the baking for an hour at 135 degrees centigrade and the reflow is significantly lower than the degree of increase in the electric resistance between the reinforcing member and the base layer in each of Comparative Examples E and F. For example, while in the Comparative Example E using the reinforcing member without surface layer, the electric resistance between the reinforcing member in the initial state before thermal treatment and the base layer was 0.142Ω, the electric resistance between the reinforcing member after being baked for an hour at 135 degrees centigrade and the base layer was 0.475Ω. As such, the electric resistance between the reinforcing member and the base layer was considerably increased by 0.333Ω as a result of the baking for an hour. When the reinforcing member had a surface layer, the electric resistance between the reinforcing member and the base layer was increased only by 0.058Ω as a result of the baking for an hour in the case of Comparative Example F in which the surface layer was made of nickel. Furthermore, each time the reflow was carried out thereafter in Comparative Examples E and F, the electric resistance between the reinforcing member and the base layer was significantly increased.

In the meanwhile, for example, in Example A, the electric resistance between the reinforcing member in the initial state before thermal treatment and the base layer was 0.008Ω, whereas the electric resistance of the reinforcing member after being baked for an hour at 135 degrees centigrade was 0.012Ω. In this way, the electric resistance between the reinforcing member and the base layer was increased only by 0.004Ω as a result of the baking for an hour. The conductive adhesive layer attached to the reinforcing member includes a lot of water in the initial state before thermal treatment. The water content decreases and the materials in the conductive adhesive layer shrink due to the baking for an hour. On account of the increase in the electric resistance of the conductive adhesive layer due to the shrink of the materials, Table 1 shows that the electric resistance of the reinforcing member rarely changes even after the baking for an hour.

In Example A, the electric resistance between the reinforcing member and the base layer did not increase too much even after the reflow was conducted plural times after the baking for an hour. The changes in the electric resistances between the reinforcing members and the base layers in Example B, Example C, and Example D were similar to the change in the electric resistance between the reinforcing member and the base layer in Example A. As such, comparing the changes in the electric resistances between the reinforcing members and the base layers in Examples A to D with the changes in the electric resistances between the reinforcing members and the base layers in Comparative Examples E and F, it is understood that the degree of increase in the electric resistance due to an influence of thermal treatment is lower in the reinforcing member having a surface layer made of noble metal than in the reinforcing member not having a surface layer made of noble metal.

(Test 2)

When the printed wiring board is provided in a high-temperature and high-moisture environment, the reinforcing member is easily deteriorated. In this regard, to research to what extent an electric resistance between a reinforcing member and a base layer increases when a printed wiring board on which an electronic component is mounted is provided in a high-temperature and high-moisture environment, the electric resistance of the reinforcing member was measured in the following conditions. That is to say, a printed wiring board to which a reinforcing member is attached in a fixed manner was baked (heated) for an hour at 135 degrees centigrade, and then reflow was performed once for the printed wiring board to attach an electronic component thereto. Thereafter, the printed wiring board was left for 250 hours in a high-temperature (60 degrees centigrade) and high-moisture (95% RH) environment. The reflow profile was set in the same manner as in Test 1.

In addition to the above, being similar to Test 1, the electric resistance between the reinforcing member and the base layer was measured in an initial state before thermal treatment, in a state after the baking for an hour at 135 degrees centigrade, and in a state after conducting the reflow once. Furthermore, the electric resistance between the reinforcing member and the base layer was measured after the printed wiring board subjected to the reflow once was left in a high-temperature (60 degrees centigrade) and high-moisture (95% RH) environment for 250 hours. The measurement results are shown in Table 2.

TABLE 2

| | CONFIGURATION OF REINFORCING MEMBER | THICKNESS OF SURFACE LAYER | INITIAL STATE | BAKING AT 135° C. AND FOR AN HOUR | FIRST REFLOW | AFTER 250 HOURS |
|---|---|---|---|---|---|---|
| EXAMPLE G1 | SUS304 + Au0.005 μm PLATING | Au0.005 μm | 0.012 Ω | 0.009 Ω | 0.022 Ω | 0.040 Ω |
| EXAMPLE H1 | SUS304 + Au0.010 μm PLATING | Au0.010 μm | 0.012 Ω | 0.006 Ω | 0.012 Ω | 0.037 Ω |
| EXAMPLE A1 | SUS304 + Au0.02 μm PLATING | Au0.02 μm | 0.008 Ω | 0.012 Ω | 0.017 Ω | 0.080 Ω |
| EXAMPLE B1 | SUS304 + Au0.20 μm PLATING | Au0.20 μm | 0.008 Ω | 0.011 Ω | 0.012 Ω | 0.059 Ω |
| EXAMPLE C1 | SUS304 + Pd0.02 μm PLATING | Pd0.02 μm | 0.009 Ω | 0.017 Ω | 0.018 Ω | 0.078 Ω |
| EXAMPLE D1 | SUS304 + Pd0.20 μm PLATING | Pd0.20 μm | 0.011 Ω | 0.019 Ω | 0.022 Ω | 0.108 Ω |
| COMPARATIVE EXAMPLE E1 | SUS304 | N/A | 0.142 Ω | 0.475 Ω | 1.039 Ω | 1.919 Ω |
| COMPARATIVE EXAMPLE I1 | SUS304 + Au0.001 μm PLATING | Au0.001 μm | 0.005 Ω | 0.067 Ω | 0.115 Ω | 0.373 Ω |
| COMPARATIVE EXAMPLE F1 | SUS304 + Ni2 μm PLATING | Ni2 μm | 0.031 Ω | 0.089 Ω | 0.143 Ω | 0.332 Ω |

As show in Table 2, in Test 2, electrolytic plating was conducted for a base made from SUS 304 to form a reinforcing member, and the electric resistance between the reinforcing member on which a gold surface layer 0.005 μm thick was formed and the base layer was measured as Example G1. Electrolytic plating was conducted for a base made from SUS 304 to form a reinforcing member, and the electric resistance between the reinforcing member on which a gold surface layer 0.01 μm thick was formed and the base layer was measured as Example H1. Electrolytic plating was conducted for a base made from SUS 304 to form a reinforcing member, and the electric resistance between the reinforcing member on which a gold surface layer 0.02 μm was formed and the base layer was measured as Example A1. Electrolytic plating was conducted for a base made from SUS 304 to form a reinforcing member, and the electric resistance between the reinforcing member on which a gold surface layer 0.20 µm and the base layer was measured as Example B1. Electrolytic plating was conducted for a base made from SUS 304 to form a reinforcing member, and the electric resistance between the reinforcing member on which a palladium surface layer 0.02 µm thick and the base layer was measured as Example C1. Electrolytic plating was conducted for a base made from SUS 304 to form a reinforcing member, and the electric resistance between the reinforcing member on which a palladium surface layer 0.20 µm thick was formed and the base layer was measured as Example D1.

In addition to the above, in Test 2, the electric resistance between the reinforcing member, which was formed solely of a base made from SUS 304 and no surface layer was formed thereon, and the base layer was measured as Comparative Example E1. Furthermore, electrolytic plating was conducted for abase made from SUS 304 to form a reinforcing member, and the electric resistance between the reinforcing member on which a gold surface layer 0.001 µm thick was formed and the base layer was measured as Example I1. Furthermore, electrolytic plating was conducted for a base made from SUS 304 to form a reinforcing member, and the electric resistance between the reinforcing member on which a nickel surface layer 2 µm thick was formed and the base layer was measured as Comparative Example F1.

A method of measuring the electric resistance between the reinforcing member and the base layer was identical with the method in Test 1. Furthermore, the materials of the base member, the ground wiring pattern, the insulating film, the adhesive member, and the conductive adhesive layer, the thickness of the base layer which was a combination of the base member and the ground wiring pattern, and the total thickness of the insulating film and the adhesive member were identical with those in Test 1.

(Comparison between Examples G1, H1, A1, B1, C1, and D1 and Comparative Examples E1, I1, and F1)

Table 2 shows that, when the printed wiring board is provided in the high-temperature and high-moisture environment, the degree of increase in the electric resistance between the reinforcing member and the base layer in each of Examples G1, H1, A1, B1, C1, and D1 is significantly lower than the degree of increase in the electric resistance between the reinforcing member and the base layer in each of Comparative Examples E1, I1, and F1. For example, in Comparative Example E1 using the reinforcing member not having the surface layer, the electric resistance between the reinforcing member and the base layer after conducting the reflow once was 1.039Ω, and after the printed wiring board of Comparative Example E1 was left in a high-temperature and high-moisture environment for 250 hours, the electric resistance between the reinforcing member and the base layer became 1.919Ω. As such, the electric resistance was considerably increased by 0.880Ω. In Comparative Example I1 in which the gold plating layer was 0.001 µm thick, the electric resistance was 0.373Ω after the printed wiring board was left in a high-temperature and high-moisture environment for 250 hours. In Comparative Example I1, the electric resistance after conducting the reflow once was 0.115Ω, and hence the electric resistance was considerably increased by 0.258Ω. Similarly, in Comparative Example F1, the electric resistance was considerably increased by 0.189Ω after the printed wiring board subjected to the reflow once was left in a high-temperature and high-moisture environment for 250 hours.

In the meanwhile, for example, in Example A1 in which the gold plating layer was 0.02 µm thick, the electric resistance between the reinforcing member and the base layer after conducting the reflow once was 0.017Ω, and the electric resistance between the reinforcing member and the base layer became 0.080Ω after the printed wiring board was left in a high-temperature and high-moisture environment for 250 hours. As such, the electric resistance between the reinforcing member and the base layer was increased only by 0.063Ω. Similarly, in Examples G1 and H1 in which the gold plating layers were 0.005 µm and 0.01 µm thick, the increase in the electric resistance was very small as compared to Comparative Examples above. In this way, comparing the change in the electric resistance between the reinforcing member and the base layer in each of Examples G1, H1, A1, B1, C1, and D1 with the change in the electric resistance between the reinforcing member and the base layer in each of Comparative Examples E1, I1, and F1, it is understood that the degree of increase in the electric resistance due to an influence of a high-temperature and high-moisture environment is lower in the reinforcing member having the surface layer made of noble metal and having specific thickness than in the reinforcing member having the surface layer made of noble metal and having thickness less than the specific thickness.

(Test 3)

When the printed wiring board is provided in a high-temperature and high-moisture environment, the reinforcing member is easily deteriorated. In this regard, to research to what extent close-contactness between a reinforcing member and a base layer decreases when a printed wiring board on which an electronic component is mounted is provided in a high-temperature and high-moisture environment, the peel strength between the reinforcing member and the base layer was measured in the following conditions. In other words, the printed wiring board attached to the reinforcing member in a fixed manner was baked (heated) at 135 degrees centigrade for an hour, and then, after the reflow was conducted once for the printed wiring board to attached the electronic component, the printed wiring board was left in a high-temperature (60 degrees centigrade) and high-moisture (95% RH) environment for 250 hours. The reflow profile was set in the same manner as in Test 1.

The peel strength between the reinforcing member and the base layer was measured in an initial state before thermal treatment and in a state after the printed wiring board was left in a high-temperature (60 degrees centigrade) and high-moisture (95% RH) environment for 250 hours. The measurement results are shown in Table 3.

The maximum peel strength at the time of breakage was measured by a tensile tester (AGS-X50S made by SHIMADZU CORPORATION) under the condition that the peeling was done at a tensile speed of 50 mm/minute and a peeling angle of 90 degrees. The close-contactness is good when it is 10 N/cm or more.

TABLE 3

| | CONFIGURATION OF REINFORCING MEMBER | THICKNESS OF SURFACE LAYER | INITIAL STATE (N/cm) | AFTER 250 HOURS |
|---|---|---|---|---|
| EXAMPLE G1 | SUS304 + Au0.005 μm PLATING | Au0.005 μm | 20 | 13.5 |
| EXAMPLE H1 | SUS304 + Au0.010 μm PLATING | Au0.010 μm | 20 | 11.8 |
| EXAMPLE A1 | SUS304 + Au0.02 μm PLATING | Au0.02 μm | 19 | 11.7 |
| EXAMPLE B1 | SUS304 + Au0.20 μm PLATING | Au0.20 μm | 18 | 10.3 |
| EXAMPLE C1 | SUS304 + Pd0.02 μm PLATING | Pd0.02 μm | 19 | 11.4 |
| EXAMPLE D1 | SUS304 + Pd0.20 μm PLATING | Pd0.20 μm | 19 | 10.8 |
| COMPARATIVE EXAMPLE E1 | SUS304 | N/A | 20 | 12.8 |
| COMPARATIVE EXAMPLE J1 | SUS304 + Au2.0 μm PLATING | Au2.0 μm | 15 | 7.6 |
| COMPARATIVE EXAMPLE I1 | SUS304 + Au0.001 μm PLATING | Au0.001 μm | 18 | 16 |
| COMPARATIVE EXAMPLE F1 | SUS304 + Ni2 μm PLATING | Ni2 μm | 19 | 8.1 |

As shown in Table 3, in Test 3 electrolytic plating was conducted for a base made from SUS 304 to form a reinforcing member, and the peel strength between the reinforcing member on which a gold surface layer 0.005 μm thick was formed and the base layer was measured as Example G1. Electrolytic plating was conducted for a base made from SUS 304 to form a reinforcing member, and the peel strength between the reinforcing member on which a gold surface layer 0.01 μm thick was formed and the base layer was measured as Example H1. Electrolytic plating was conducted for a base made from SUS 304 to form a reinforcing member, and the peel strength between the reinforcing member on which a gold surface layer 0.02 μm thick was formed and the base layer was measured as Example A1. Electrolytic plating was conducted for a base made from SUS 304 to form a reinforcing member, and the peel strength between the reinforcing member on which a gold surface layer 0.20 μm thick was formed and the base layer was measured as Example B1. Electrolytic plating was conducted for a base made from SUS 304 to form a reinforcing member, and the peel strength between the reinforcing member on which palladium surface layer 0.02 μm thick was formed and the base layer was measured as Example C1. Electrolytic plating was conducted for a base made from SUS 304 to form a reinforcing member, and the peel strength between the reinforcing member on which a palladium surface layer 0.20 μm thick was formed and the base layer was measured as Example D1.

In addition to the above, in Test 3, the peel strength between the reinforcing member formed solely of a base made from SUS 304 and no surface layer was formed thereon and the base layer was measured as Comparative Example E1. Furthermore, electrolytic plating was conducted for a base made from SUS 304 to form a reinforcing member, and the peel strength between the reinforcing member on which a gold surface layer 0.001 μm thick was formed and the base layer was measured as Example I1. Furthermore, electrolytic plating was conducted for a base made from SUS 304 to form a reinforcing member, and the peel strength between the reinforcing member on which a gold surface layer 2.0 μm thick was formed and the base layer was measured as Example J1. Furthermore, electrolytic plating was conducted for a base made from SUS 304 to form a reinforcing member, and the peel strength between the reinforcing member on which a nickel surface layer 2 μm thick was formed and the base layer was measured as Comparative Example F1.

The materials of the base member, the ground wiring pattern, the insulating film, the adhesive member, and the conductive adhesive layer, the thickness of the base layer which was a combination of the base member and the ground wiring pattern, and the total thickness of the insulating film and the adhesive member were identical with those in Test 1.

(Comparison between Examples and Comparative Examples)

For example, in Example G1 in which the gold plating layer was 0.02 μm thick, the peel strength between the reinforcing member and the base layer after conducting the reflow once was 20 N/cm, and after the printed wiring board was left in a high-temperature and high-moisture environment for 250 hours, the peel strength between the reinforcing member and the base layer became 13.5 N/cm. As such, in Example G1, the close-contactness between the reinforcing member and the base layer was good even after the printed wiring board was left in a high-temperature and high-moisture environment for 250 hours. Similarly, in Examples H1, A1, B1, C1, and D1, the peel strength was maintained to be 10 N/cm or higher even after the printed wiring board was left in a high-temperature and high-moisture environment for 250 hours, and the close-contactness between the reinforcing member and the base layer was good.

In the meanwhile, in Comparative Examples J1 and F1 each having thicker plating layer (surface layer) than in Examples, the peel strength became lower than 10 N/cm after the printed wiring board was left in a high-temperature and high-moisture environment for 250 hours, and the close-contactness between the reinforcing member and the base layer became no longer good. As such, comparing the change in the peel strength between the reinforcing member and the base layer in each of Examples G1, H1, A1, B1, C1, and D1 with the change in the peel strength between the reinforcing member and the base layer in each of Comparative Examples J1 and F1, it is understood that, after the printed wiring board is provided in a high-temperature and high-moisture environment, the peel strength is more suitably maintained with the reinforcing member having the surface layer made of noble metal and under specific thickness than with the reinforcing member having the surface layer made of noble metal and over specific thickness.

That is to say, Test 1 shown in Table 1, Test 2 shown in Table 2, and Test 3 shown in Table 3 indicate that, as the generation of a passive film on the reinforcing member is prevented in thermal treatment or a high-temperature and high-moisture environment thanks to corrosion resistance of noble metal provided on the surface layer of the reinforcing plate with specific thickness. Because passive film is not generated on the reinforcing member, not only the increase in the electric resistance is restrained in the reinforcing member and the conductive adhesive layer but the decrease in the close-contactness between the reinforcing member and the base layer is also restrained, and this restraint may be maintained.

REFERENCE SIGNS LIST

1 PRINTED WIRING BOARD
90a ELECTROMAGNETIC WAVE
110 PRINTED WIRING BOARD MAIN BODY
111 INSULATING FILM
112 BASE MEMBER
113 ADHESIVE LAYER
115 GROUND WIRING PATTERN
120 SHIELD FILM
121 INSULATING LAYER
122 CONDUCTIVE LAYER
123 CONDUCTIVE MEMBER
130 CONDUCTIVE COMPOSITION LAYER
135 REINFORCING MEMBER
135a BASE
135b NICKEL LAYER
150 ELECTRONIC COMPONENT
160 HOLE PART

The invention claimed is:

1. A reinforcing member for a printed wiring board, which is disposed opposite to a predetermined part of a ground wiring pattern of the printed wiring board, the reinforcing member comprising:
   a conductive metal base;
   a first surface layer formed on a first side of the conductive metal base and opposing and in electrical conduction with the predetermined part of the ground wiring pattern via a conductive composition layer;
   a second surface layer formed on a second side of the conductive metal base and in electrical conduction with an external ground member which is at a ground potential, wherein,
   the first side and the second side are on opposite sides of the conductive metal base,
   the second surface layer has higher conductivity and corrosion resistance than the metal base, and
   the second surface layer is 0.004 to 0.2 μm thick.

2. The reinforcing member according to claim 1, wherein, the first and second surface layers are formed of alloy which is made of noble metal or mainly made of noble metal.

3. The reinforcing member according to claim 2, wherein, the noble metal is gold or palladium.

4. The reinforcing member according to claim 1, wherein, the conductive metal base is formed of stainless steel.

5. The reinforcing member according to claim 1, further comprising a conductive composition layer which is provided on the first surface side of the conductive metal base.

6. The reinforcing member according to claim 1, wherein, at least one of the first and second surface layers comprise an assembly of lines and/or dots.

7. A flexible printed wiring board comprising:
   a base member;
   a ground wiring pattern formed on the base member; and
   the reinforcing member according to claim 1, which is disposed opposite to a predetermined part of the ground wiring pattern.

* * * * *